US007371589B2

(12) United States Patent
Kweon

(10) Patent No.: US 7,371,589 B2
(45) Date of Patent: May 13, 2008

(54) FERROELECTRIC RANDOM ACCESS MEMORY CAPACITOR AND METHOD FOR MANUFACTURING THE SAME

(75) Inventor: Soon-Yong Kweon, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 321 days.

(21) Appl. No.: 11/208,259

(22) Filed: Aug. 18, 2005

(65) Prior Publication Data

US 2006/0014307 A1 Jan. 19, 2006

(51) Int. Cl.
*H01L 21/00* (2006.01)

(52) U.S. Cl. .......................... 438/3; 438/238; 438/239; 438/244

(58) Field of Classification Search .................... 438/3, 438/238, 239, 243, 244, 253, 386, 387, 396, 438/399
See application file for complete search history.

(56) References Cited

U.S. PATENT DOCUMENTS 5,258,093 A * 11/1993 Maniar .......................... 438/3
6,340,621 B1 * 1/2002 Anderson et al. ........... 438/396
2001/0046717 A1 * 11/2001 Zhen ............................ 438/3
2002/0105017 A1 8/2002 Kim et al.
2002/0123158 A1 * 9/2002 Murai ........................... 438/3
2004/0137646 A1 * 7/2004 Song et al. .................... 438/3

FOREIGN PATENT DOCUMENTS

JP 2001-36024 2/2001

OTHER PUBLICATIONS

KR Laid-Open No. 2003-23844.
0.18 μm SBT-Based Embedded FeRAM Operating at a Low Voltage of 1.1V (2003 Symposium on VLSI Technology Digest of Technical Papers).
Highly Manufacturable and Reliable 32 Mb FRAM Technology with Novel BC and Capacitor Cleaning Process (2003 Symposium on VLSI Technology Digest of Technical Papers).

* cited by examiner

*Primary Examiner*—Kevin M. Picardat
*Assistant Examiner*—Neil Prasad
(74) *Attorney, Agent, or Firm*—Blakely, Sokoloff, Taylor & Zafman LLP

(57) ABSTRACT

The method for manufacturing an FeRAM capacitor with a merged top electrode plate line (MTP) structure is employed to prevent a detrimental impact on the FeRAM and to secure a reliable FeRAM device. The method includes steps of: preparing an active matrix obtained by a predetermined process; forming a first conductive layer, a dielectric layer and a second conductive layer on the active matrix in sequence; forming a hard mask on the second conductive layer; patterning the second conductive layer, the dielectric layer and the first conductive layer by using the hard mask, thereby forming a vertical capacitor stack, a width of the capacitor stack being larger than that of the storage node contact; forming a second ILD embracing the capacitor stack; planarizing the second ILD till the top face of the hard mask is exposed; removing the hard mask to form an opening above the top electrode; and forming a plate line of which a width is larger than that of the capacitor stack.

32 Claims, 8 Drawing Sheets

FERROELECTRIC RANDOM ACCESS MEMORY CAPACITOR AND METHOD FOR MANUFACTURING THE SAME

FIELD OF THE INVENTION

The present invention relates to a semiconductor device and a method for manufacturing the same; and, more particularly, to a ferroelectric random access memory (FeRAM) capacitor having a merged top electrode plate line (MTP) structure therein and a method for manufacturing the same.

DESCRIPTION OF THE PRIOR ART

With the recent progress of film deposition techniques, researches for a nonvolatile memory cell using a ferroelectric thin film have increasingly been developed. This nonvolatile memory cell is a high-speed rewritable nonvolatile characteristic utilizing high-speed polarization/inversion and residual polarization of a ferroelectric capacitor thin film.

Therefore, a ferroelectric random access memory (FeRAM) where a ferroelectric material such as strontium bismuth tantalate (SBT) and lead zirconium titanate (PZT) is increasingly used for the capacitor thin film in place of a conventional silicon oxide film or a silicon nitride film, because it assures a low-voltage and high-speed performance, and further, does not require a periodic refresh to prevent loss of information during standby intervals like a dynamic random access memory (DRAM).

Since a ferroelectric material has a high dielectric constant ranging from hundreds to thousands value and a stabilized residual polarization property at a room temperature, it is being applied to the FeRAM device as the capacitor thin film. In case of employing the FeRAM device, information data are stored by polarization of dipoles when electric field is applied thereto. Even if electric field is removed, the residual polarization becomes still remained so that one of information data, i.e., “0” or “1”, can be stored.

Referring to FIGS. 1A to 1E, there are cross sectional views setting forth a conventional method for manufacturing the FeRAM capacitor.

In FIG. 1A, the conventional method for manufacturing the FeRAM capacitor begins with preparing an active matrix 105 including a semiconductor substrate 110, field oxide (FOX) regions 112, a source/drain region 114, a first inter-layer dielectric (ILD) 116 and a storage node contact 115. In detail, the FOX regions 112 and the source/drain region 114 are formed in predetermined locations of the semiconductor substrate 110 by using a typical method. Thereafter, the first ILD 116 is formed on the semiconductor substrate 110 using a material such as boron-phosphor-silicate-glass (BPSG), high density plasma (HDP) oxide. Afterward, the first ILD 116 is patterned into a first predetermined configuration, to thereby form a contact hole (not shown) and expose the source/drain region 114. Then, a first barrier 118 is deposited over the resultant structure including the contact hole and the top face of the first ILD 116 by using a method such as a plasma vapor deposition (PVD) or an ionized metal plasma (IMP) method, wherein the first barrier 118 employs a double layer of a Ti layer and a TiN layer.

After forming the first barrier 118, a typical thermal treatment process such as a rapid thermal process (RTP) is carried out so as to form a titanium silicide ($TiSi_2$) 120 between the first barrier 118 and the source/drain region 114. It is noted that the typical thermal treatment process can be omitted in case of using a chemical vapor deposition (CVD) method in order to deposit the first barrier 118 because the $TiSi_2$ layer 120 is formed by an inter-reaction between the Ti layer and an underlying source/drain region 114 during the CVD process.

Subsequently, a second barrier 122 is deposited on the first barrier 118 for preventing a diffusion phenomenon between a tungsten (W) plug 124 and the source/drain region 114. In case of forming the first barrier 118 by using the PVD method, a deposition process for forming the second barrier 122 is required. However, a deposition process for forming the second barrier 122 can be also omitted in case of using the CVD method.

Following a formation of the second barrier 122, a tungsten layer is deposited over the resultant structure till the contact hole is completely filled with tungsten. Thereafter, the first barrier 118, the second barrier 122 and the tungsten layer are selectively etched into a first predetermined configuration so that the top face of the tungsten plug 124 be lower than the top face of the fist ILD 116. That is, a recess is formed in the storage node contact 115. Herein, it is preferable to form the recess with a depth ranging from about 500 Å to about 1,000 Å because the deposition thickness of the tungsten layer is determined by considering the diameter of the storage node 215. In a next step, a third barrier 126 is formed in the recess by using the CMP method for preventing oxygen diffusion into the tungsten plug 124 during a post annealing process, wherein the third barrier uses a material such as TiN, TiAlN, TiSiN, RuTiN or the like.

Subsequently, referring to FIG. 1B, an oxide layer 128 and the first conductive layer 130 are formed on top faces of the storage node 115 and the first ILD 116 in sequence. Herein, the first conductive layer employs multi-layers in which an iridium (Ir) layer, an iridium oxide (IrOx) layer and a platinum (Pt) layer are formed sequentially.

In an ensuing step as shown in FIG. 1C, the first conductive layer 128 and the oxide layer 128 are patterned into a second predetermined configuration, thereby obtaining a bottom electrode 130A and a glue layer 128A.

In a next step as shown in FIG. 1D, a second ILD 132 is formed on the first ILD 116 and the bottom electrode 130A and is planarized by using a method such as the CMP, an etchback process or the like till the top face of the bottom electrode 130A is exposed. During the planarization of the second ILD 132, there is happened a step (X) between the second ILD 132 and the bottom electrode 130A so that a planarized top face of the second ILD 132 is inevitably lower than the top face of the bottom electrode 130A.

Subsequently, referring to FIG. 1E, a ferroelectric dielectric layer 134 is formed on the bottom electrode 130A and the second ILD 132 by using a typical deposition process, wherein the ferroelectric dielectric layer 134 employs a material such as strontium bismuth tantalate (SBT), lead zirconium titanate (PZT), barium strontium titanate (BST) or the like.

Afterward, a second conductive layer is formed on the ferroelectric dielectric layer 134 and is patterned into a third predetermined configuration, thereby forming a top electrode 136. In general, an annealing process is carried out for crystallizing the ferroelectric dielectric layer 134 after forming the ferroelectric dielectric layer 134 or the top electrode 136. Therefore, the conventional method for manufacturing the FeRAM capacitor is completed.

However, the conventional method for manufacturing the FeRAM capacitor as aforementioned suffers from several shortcomings. First, since there is inevitably a difference between crystallization of the ferroelectric dielectric layer 134 on the bottom electrode 130A and that of the ferroelectric dielectric layer 134 on the second ILD 132, there is a problem that crystallization of the ferroelectric dielectric layer 134 on the second ILD 132 is not so good as the ferroelectric dielectric layer 134 on the bottom electrode 130A. In the long run, a ferroelectric property of the FeRAM capacitor becomes deteriorated.

Second, as described already, during the planarization of the second ILD 132, there may be happened the step (X) between the second ILD 132 and the bottom electrode 130A so that there may be happened a crack in the ferroelectric dielectric layer 134 during the deposition process of the ferroelectric dielectric layer 134. In addition to a generation of the crack, the higher is the step (X), the worse is a step coverage of the ferroelectric dielectric layer 134. In this case, there may be micro-voids (not shown) around exposed sidewalls of the bottom electrode 130A. Therefore, the ferroelectric dielectric layer 134 may be delaminated during the post annealing process owing to the micro-voids.

Third, since the annealing process is carried out after patterning the first conductive layer, the second barrier 122 may be oxidized by oxygen-diffusion between sidewalls of the bottom electrode 130A and surfaces of the second ILD 132. Thus, the electrical property of the FeRAM capacitor is deteriorated after all.

SUMMARY OF THE INVENTION

It is, therefore, an object of the present invention to provide a ferroelectric random access memory (FeRAM) capacitor having a merged top electrode plate line (MTP) structure therein by employing a one-step etching for forming a vertical capacitor stack, thereby enhancing a ferroelectric property and preventing a crack in the ferroelectric layer.

It is another object of the present invention to provide a method for manufacturing the FeRAM device with the MTP structure by employing a one-step etching for forming a vertical capacitor stack, thereby enhancing a ferroelectric property and preventing a crack in the ferroelectric layer.

In accordance with one aspect of the present invention, there is provided an FeRAM capacitor with the MTP having the MTP structure therein, including: an active matrix including a semiconductor substrate, field oxide regions, a source/drain region, a first interlayer dielectric (ILD) and a storage node contact; a capacitor stack including a bottom electrode, a ferroelectric layer and a top electrode, wherein the bottom electrode, the ferroelectric layer and the top electrode are formed on the storage node and predetermined portions of the first ILD and a width of the capacitor stack is relatively larger than that of the storage node; a second ILD enclosing capacitor stack, wherein the top face of the top electrode is not covered with the second ILD; and a plate line formed on the top face of the top electrode and predetermined portions of the second ILD, the width of the plate line being larger than that of the top electrode.

In accordance with another aspect of the present invention, there is provided a method for manufacturing an FeRAM device having the MTP structure therein, the method including the steps of: a) preparing an active matrix including a semiconductor substrate, a source/drain region, FOX regions, a first ILD, a storage node contact; b) forming a first conductive layer, a dielectric layer and a second conductive layer on the active matrix in sequence; c) forming a hard mask on a predetermined location of the second conductive layer; d) patterning the second conductive layer, the dielectric layer and the first conductive layer by using the hard mask, thereby forming a capacitor stack having a bottom electrode, a ferroelectric layer and a top electrode, a width of the capacitor stack being larger than that of the storage node contact; e) forming a second ILD on the first ILD and the hard mask, wherein the second ILD embraces the capacitor stack; f) planarizing the second ILD till the top face of the hard mask is exposed; g) removing the hard mask to form an opening above the top electrode; and h) forming a third conductive layer over the resultant structure and patterning into a predetermined configuration, thereby obtaining a plate line of which a width is larger than that of the capacitor stack, the plate line being electrically connected to the top electrode.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1A:
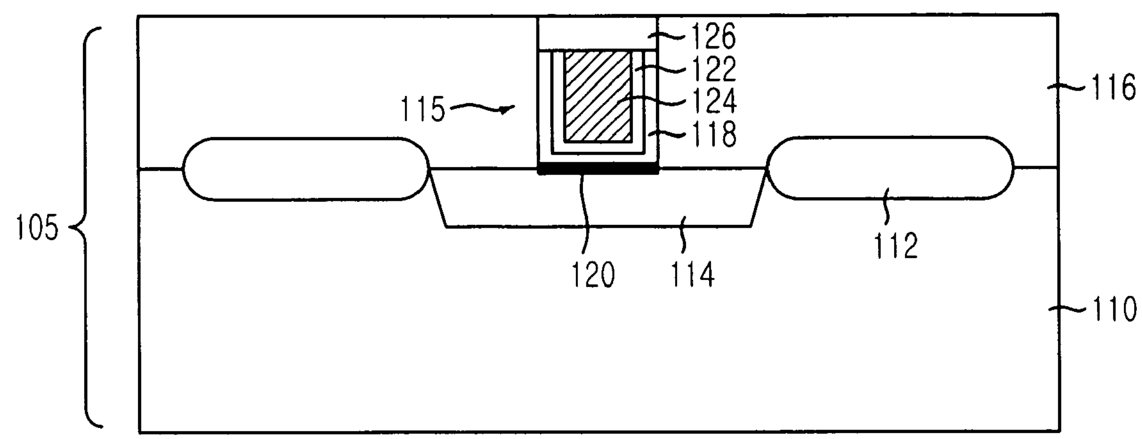
FIGS. 1A to 1E are cross sectional views setting forth a conventional method for manufacturing a ferroelectric random access memory (FeRAM) capacitor.
Figure 1B:
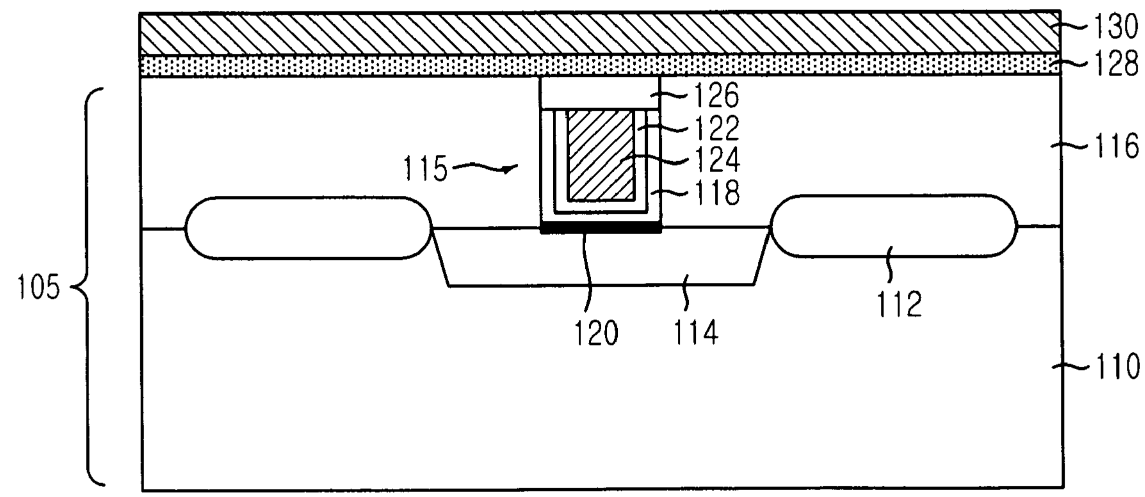
Figure 1C:
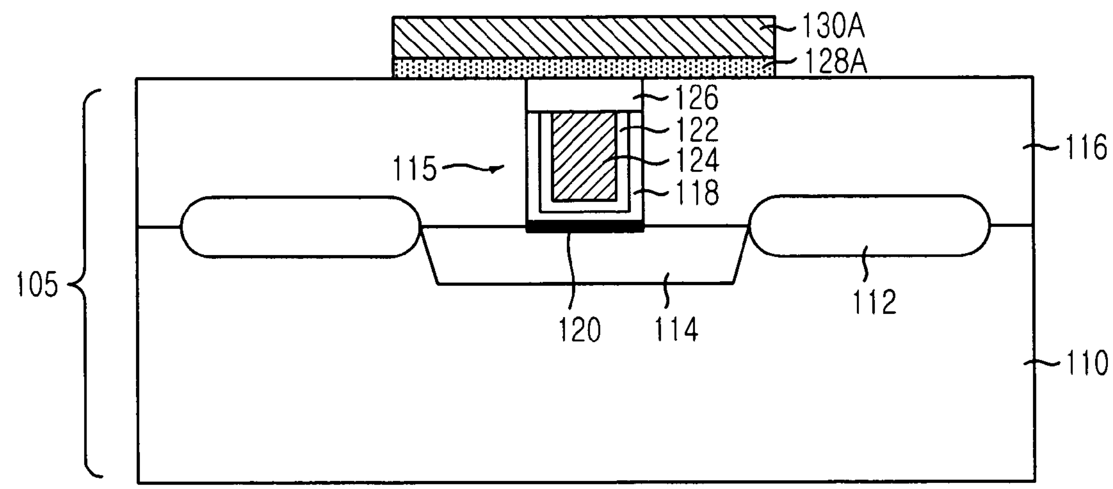
Figure 1D:
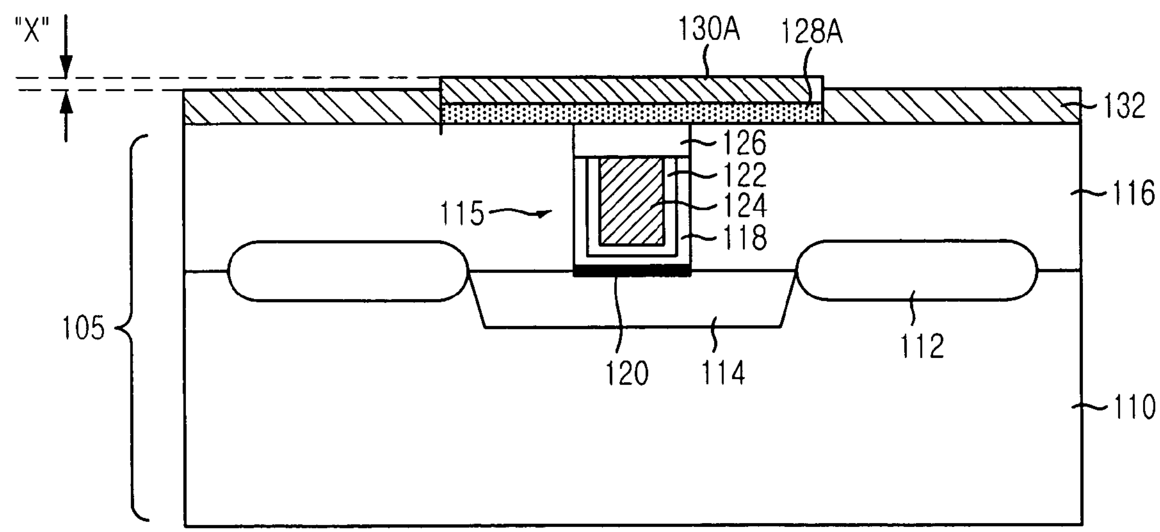
Figure 1E:
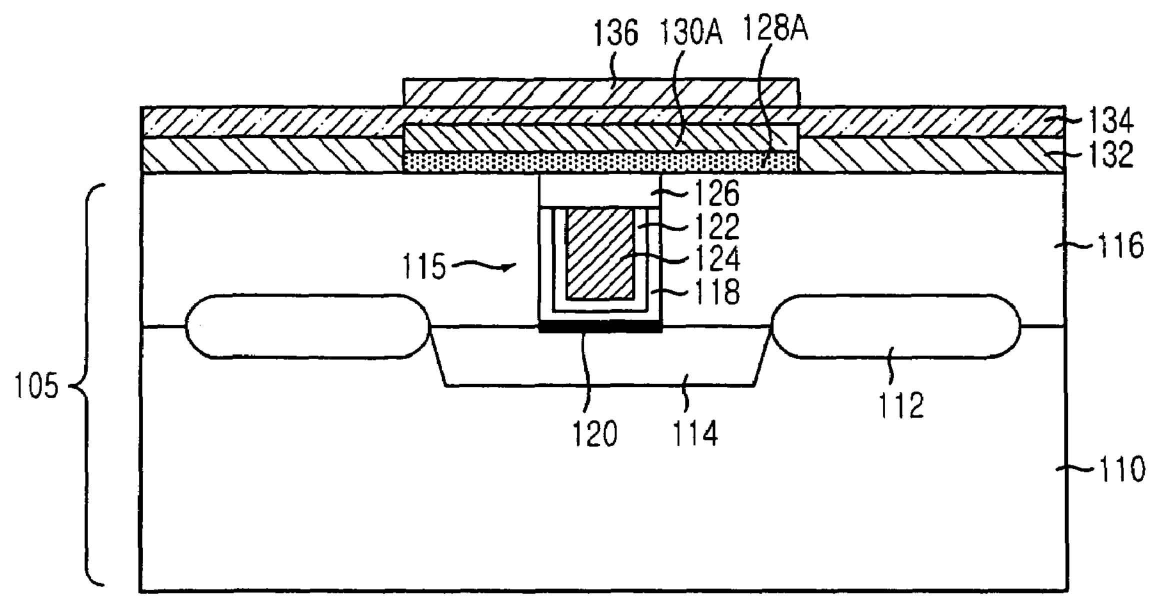

There are provided in FIG. 2, FIGS. 3A to 3F, FIG. 4 and FIG. 5 cross sectional views and a plane view setting forth a ferroelectric random access memory (FeRAM) capacitor and a method for manufacturing the same in accordance with a preferred embodiment of the present invention. It should be noted that like parts appearing in FIG. 2, FIGS. 3A to 3F, FIG. 4 and FIG. 5 are represented by like reference numerals.

Figure 2:
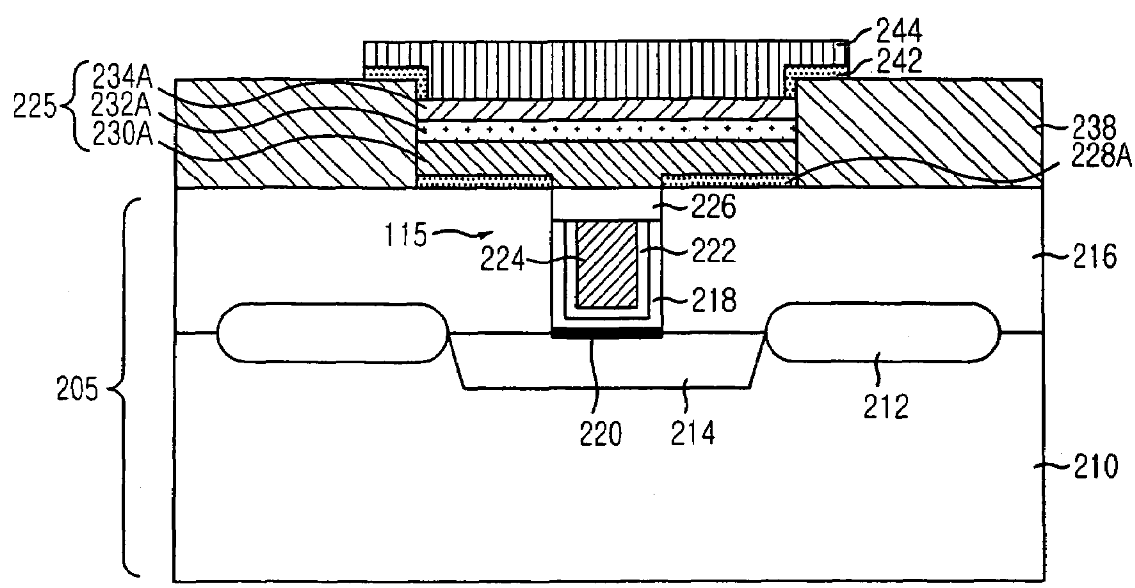
FIG. 2 is a cross sectional view illustrating an FeRAM capacitor in accordance with a preferred embodiment of the present invention.

Referring to FIG. 2, there is shown a cross sectional view illustrating an inventive FeRAM capacitor 200 with a merged top electrode plate line (MTP) structure including an active matrix 205, a capacitor stack 225, a second interlayer dielectric (ILD) 238 and a plate line 244. The active matrix 205 includes a semiconductor substrate 210 having field oxide (FOX) regions 212 and a source/drain region 214, a first ILD 216 formed on the semiconductor substrate 210 and a storage node contact 215 achieved after patterning the first ILD 216 into a predetermined configuration.

Herein, the storage node contact 215 is provided with a titanium silicide ($TiSi_2$) layer 220, a first barrier 218, a second barrier 222, a tungsten plug 224, and a third barrier 226, wherein the first barrier 218 employs a double layer of titanium (Ti) and titanium nitride (TiN), the second barrier 222 employs TiN and the third barrier 226 employs material selected from the group consisting of TiN, TiAlN, TiSiN and RuTiN. The titanium silicide layer 220 is achieved by a rapid thermal process (RTP) after forming the first barrier 218, thereby forming an ohmic contact between the source/drain region 214 and the first barrier 228.

The capacitor stack 225 is electrically connected to the storage node contact 215, the capacitor having a bottom electrode 230A, a ferroelectric layer 232A formed on the bottom electrode 230A and a top electrode 234A formed on the ferroelectric layer 232A. The bottom electrode 230A is formed over the storage node contact 215 uses a material such as iridium (Ir), iridium oxide (IrOx) and platinum (Pt), ruthenium (Ru), rhodium (Rh) and a combination thereof. Here, in case of using Ir/IrOx/Pt as the bottom electrode 230A, it is preferable to form the Ir layer with a thickness ranging from about 500 Å to about 1,500 Å, the $IrO_2$ layer with the thickness ranging from about 50 Å to about 500 Å and the Pt layer with the thickness ranging from about 100 Å to about 1,000 Å. The bottom electrode 230A is formed by using a method such as the chemical vapor deposition (CVD), the physical vapor deposition (PVD), the atomic layer deposition (ALD), the plasma enhanced ALD (PEALD) or the like.

Since the Ir layer has poor adhesive property with respect to the underlying first ILD 216, there is formed a first glue layer 228A for enhancing an adhesive property between the bottom electrode 230A and the first ILD 216. Herein, the first glue layer 228A is formed by using a method such as the ALD, the CMP, the PVD employing a material such as alumina ($Al_2O_3$) or the like. Furthermore, it is preferable that the first glue layer is formed with the thickness as thin as possible, e.g., in the range of about 5 Å to about 50 Å.

In addition, the ferroelectric layer 232A employs a material selected from the group consisting of bismuth lanthanum titanate (BLT), strontium bismuth tantalate (SBT), strontium bismuth niobate tantalate (SBTN) and lead zirconate titanate (PZT), wherein the thickness of the ferroelectric layer 232A ranges preferably about 50 Å to about 2,000 Å. Additionally, the ferroelectric layer 232A is formed by using a method such as a spin-on coating, the PVD, the CVD, the ALD or the like. The top electrode 234A is formed with the thickness in a range of about 100 Å to about 1,000 Å, employing a material selected from the group consisting of Pt, Ir, Ru, $IrO_2$, $RuO_2$, Pt/$IrO_2$/Ir, $IrO_2$/Ir, $RuO_2$/Ru and Pt/$RuO_2$. The top electrode 234A is formed by using a method such as the CVD, the PVD, the ALD, the PEALD or the like.

The second ILD 238 uses a material such as phosphorous silicate glass (PSG), spin-on-glass (SOG), undoped silicate glass (USG), tetra-ethyl-ortho-silicate (TEOS) or the like. Alternatively, the second ILD 238 can be formed in a shape of a double layer. That is, a first layer is formed on sidewalls of the capacitor stack 225 and the top face of the first ILD 216 and subsequently a second layer is formed on the first layer. Here, the first layer uses a material such as titanium oxide ($TiO_2$), TEOS, $Al_2O_3$ or the like and the second layer employs a material such as PSG, SOG, TEOS or the like.

The plate line 244 is formed over the capacitor stack 225 with the thickness in the rage of about 500 Å to about 3,000 Å by using a method such as the PVD, the CVD, the ALD or the like, which is electrically connected to the top electrode 234A by employing a material such as Pt, Ir, Ir/$IrO_2$ or the like.

Referring to FIGS. 3A to 3F, there are cross sectional views setting forth a method for manufacturing an FeRAM capacitor with an MTP structure therein.

Figure 3A:
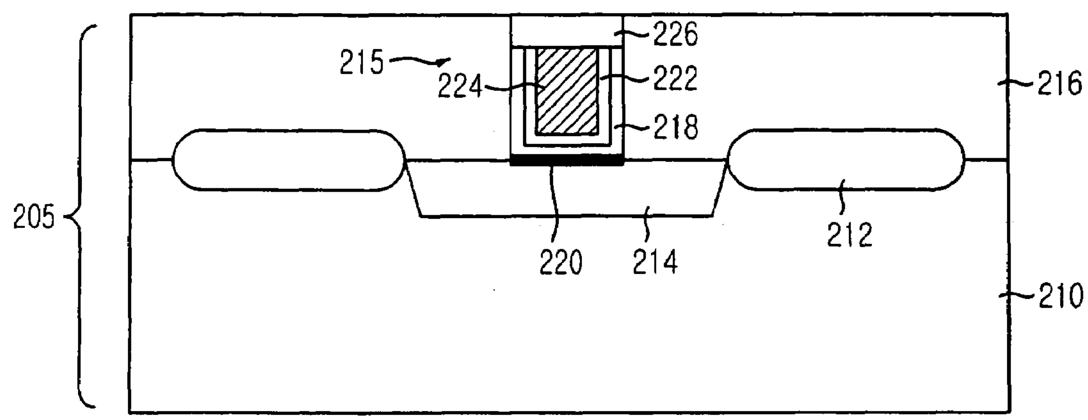
FIGS. 3A to 3F are cross sectional views depicting a method for manufacturing an FeRAM capacitor in accordance with a preferred embodiment of the present invention.

In FIG. 3A, the inventive method for manufacturing the FeRAM capacitor begins with preparing an active matrix 205 including a semiconductor substrate 210 obtained by a predetermined process, a first ILD 216 and a storage node contact 215, wherein the storage node contact 215 is achieved after patterning the first ILD 216 into a first predetermined configuration. A preparation of the active matrix 205 is more illustrated in detail hereinafter.

To begin with, field oxide (FOX) regions 212 and a source/drain region 214 are formed in predetermined locations of the semiconductor substrate 210 by using a typical method. Thereafter, a first ILD 216 is formed on the semiconductor substrate 210 employing a material such as boron-phosphor-silicate-glass (BPSG), high density plasma (HDP) oxide and is patterned into a second predetermined configuration, thereby forming a contact hole (not shown) and exposing the source/drain region 214. Then, a first barrier 218 is deposited over the resultant structure including the contact hole and the top face of the first ILD 216 by using a method such as the PVD or an ionized metal plasma (IMP) method, wherein the first barrier 218 employs a double layer of a Ti layer and a TiN layer.

After forming the first barrier 218, an RTP process is carried out in $N_2$ gas ambient for about 20 seconds at about 830° C. to induce an inter-reaction between Ti atoms in the first barrier 218 and Si atoms in the underlying source/drain region 214, thereby forming a $TiSi_2$ layer. It is noted that the RTP process for forming the $TiSi_2$ layer 220 can be omitted in case of using a CVD method in order to deposit the Ti/TiN layer because the $TiSi_2$ layer 220 is formed during the CVD process.

Subsequently, a second barrier 222 is deposited on the first barrier 218 with the thickness of about 200 Å for preventing a diffusion phenomenon between a tungsten plug 224 and the source/drain region 214. In case of forming the first barrier 218 by using the PVD method, a deposition process for forming the second barrier 222 is required. However, the deposition process for forming the second barrier 222 can be omitted in case of using the CVD method.

Following a formation of the second barrier 222, a tungsten layer is deposited over the resultant structure till the contact hole is completely filled with tungsten. Thereafter, the first barrier 218, the second barrier 222 and the tungsten layer are selectively etched into a third predetermined configuration so that the top face of the tungsten plug 224 is lower than the top face of the fist ILD 216. That is, a recess is formed in the storage node contact 215. Herein, the recess can be achieved by over-etching the tungsten layer, the first barrier 218 and the second barrier 222 sequentially. Alternatively, after the tungsten layer is planarized by using the CMP process, the first and the second barriers 218, 222 are over-etched so as to form the recess in the storage node 215. In addition, after the tungsten layer, the first barrier 218 and the second barrier 222 are planarized by means of the CMP process, a supplementary etchback process can be introduced in order to form the recess in the storage node 215.

Herein, it is preferable to form the recess with a depth ranging from about 500 Å to about 1,000 Å. Since the deposition thickness of the tungsten layer is determined by considering the diameter of the storage node 215, the tungsten layer is preferably formed with the thickness of about 3,000 Å when a diameter of the storage node 215 is about 0.30 μm.

In a next step, a third barrier 226 is formed in the recess for preventing oxygen diffusion into the tungsten plug 224 during a post annealing process by using the CMP method, wherein the third barrier 226 uses a material such as TiN, TiAlN, TiSiN, RuTiN or the like.

Figure 3B:
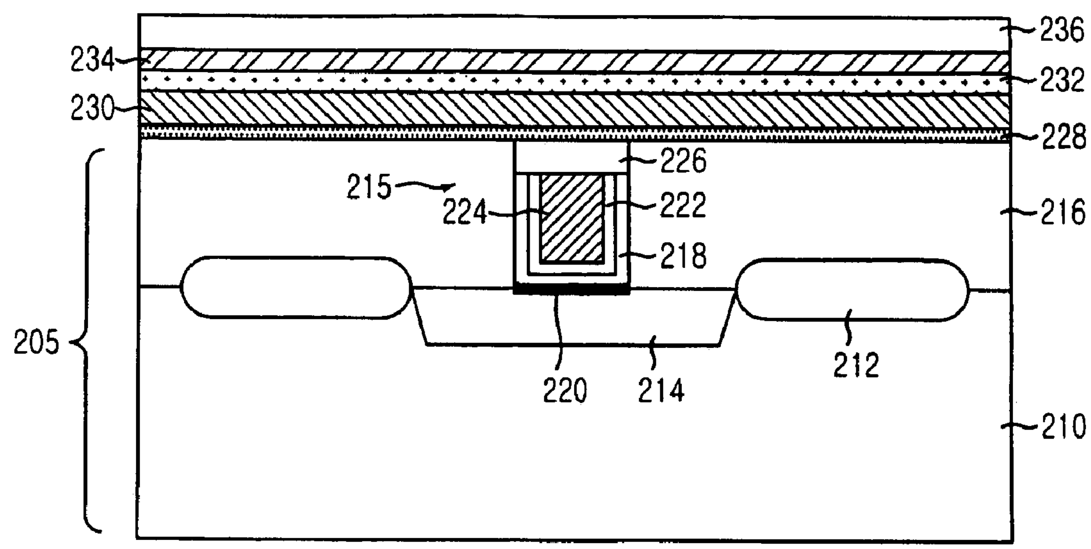

Thereafter, referring to FIG. 3B, a first oxide layer 228 of alumina ($Al_2O_3$) is formed on the active matrix 205 with the thickness in a range of about 5 Å to about 50 Å by using a method such as the ALD, CVD, PVD or the like. The reason of forming the first oxide layer 228 as thin as possible is that the first glue layer 28 can be removed easily during a post annealing process without a supplementary removing process.

In an ensuing step, a first conductive layer 230, a dielectric layer 232, a second conductive layer 234 and a hard mask layer 236 are formed on the first oxide layer 228 sequentially. Herein, the first conductive layer 230 is formed by using method such as the CVD, PVD, ALD, PEALD or the like, wherein the first conductive layer 230 employs Pt, Ir, Ru, Re, Rh or a combination thereof. For instance, the first conductive layer 230 can be formed by depositing Ir, $IrO_2$ and Pt on the first oxide layer 228 in sequence, wherein the thickness of Ir, IrO2 and Pt ranges preferably from about 500 Å to about 1,500 Å, about 50 Å to about 500 Å, about 100 Å to about 1,000 Å, respectively. The dielectric layer 234 is formed by using a method such as the CVD, ALD, a spin coating or the like with the thickness in the range of about 50 Å to about 2,000 Å, the ferroelectric dielectric layer 234 employing a material such as SBT, SBTN, PZT, BLT or the like. The second conductive layer 236 is formed with the thickness ranging from about 100 Å to about 1,000 Å by using a method such as the CVD, PVD, ALD, PEALD or the like, wherein the second conductive layer 236 uses a material selected from the group consisting of Pt, Ir, Ru, $IrO_2$, $RuO_2$, Pt/$IrO_2$, Pt/$IrO_2$/Ir, $IrO_2$/Ir, $RuO_2$/Ru, Pt/$RuO_2$/Ru and Pt/$RuO_2$. The hard mask layer 236 is formed with the thickness ranging from about 500 Å to about 2,000 Å using a material such as TiN, TaN or the like.

It is preferable that the first oxide layer 228, the first conductive layer 230, the dielectric layer 232, the second conductive layer 234 and the hard mask layer 236 should be formed with the thickness as thin as possible in consideration of a patterning process margin in the present invention.

Afterward, an annealing process is carried out in $O_2$, $N_2$, Ar, $O_3$, He, Ne or Kr ambient for about 10 seconds to about 5 hours at the temperature in the range of about 400° C. to about 800° C. for recovering a ferroelectric property. This annealing process can be performed after forming the second conductive layer 236 or the dielectric layer 232. The annealing process is carried out in a diffusion furnace or the RTP equipment. Alternatively, the annealing process can be carried out in the diffusion furnace after being carried out in the RTP equipment repeatedly and vice versa.

Following the annealing process, after a photoresist pattern (not shown) is formed on the hard mask layer 236, the hard mask layer 236 is patterned into a fourth predetermined configuration, thereby forming a hard mask 236A.

Figure 3C:
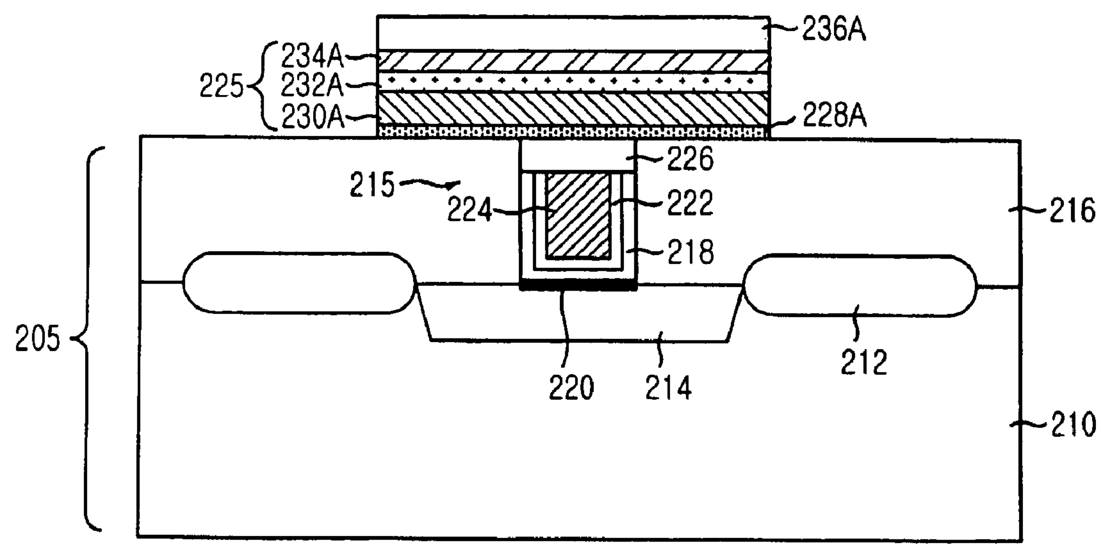

Thereafter, the second conductive layer 234, the dielectric layer 232, the first conductive layer 230 and the first oxide layer 228 are etched by using the hard mask 236A, thereby forming a capacitor stack 225 having a bottom electrode 230A, a ferroelectric layer 232A and a top electrode 234A and forming a first glue layer 228A, as shown in FIG. 3C. After the patterning process, it is noted that the hard mask 236A still remains on the top face of the top electrode 234A.

Herein, the first glue layer 228 can be removed during the annealing process by using the RTP and SC-1 rinsing process, thereby forming openings between the bottom electrode 230A and the first ILD 216. In detail, the RTP is carried out to expand the tungsten plug 224 so that the third barrier 226 experiences a compressive stress. Accordingly, there is happened a crack in the first glue layer 228 disposed on the top face of the third barrier 226. The cracked first glue layer 228 is removed through the SC-1 rinsing process. Alternatively, the first glue layer 228 can be removed during the annealing process for recovering the ferroelectric properties because the first glue layer 228 is formed thinly enough.

Figure 3D:
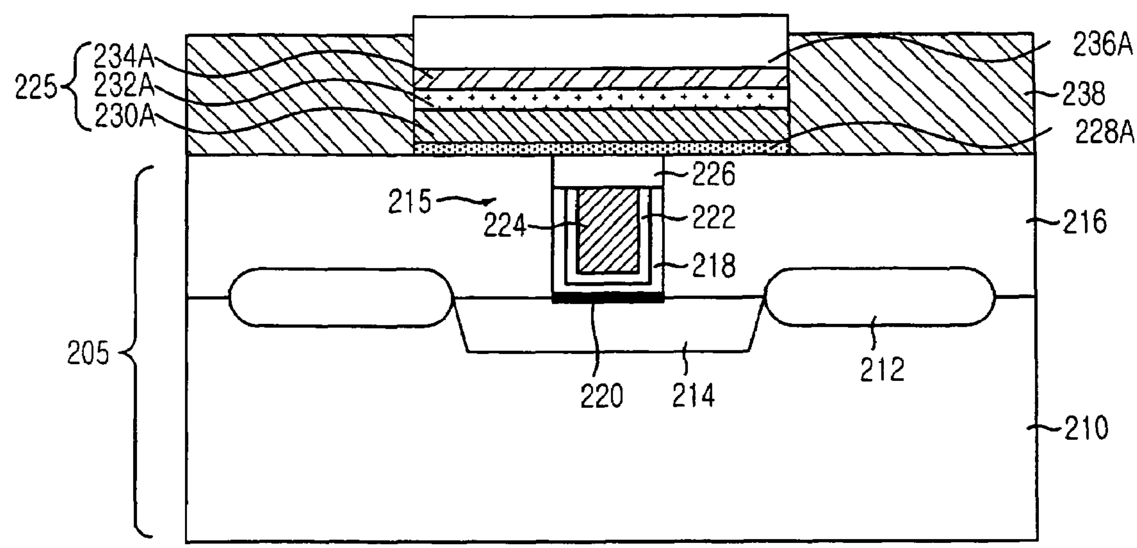

In a next step as shown in FIG. 3D, a second ILD 238 is formed on the first ILD and the capacitor stack 225, wherein the second ILD 238 is higher than the capacitor stack 225. Then, the second ILD 238 is planarized by using a method such as the etchback or the CMP process till the top face of the hard mask 236A is exposed. The planarization of the second ILD 238 can be achieved by carrying out the etchback process after carrying out the CMP process. Herein, the second ILD 238 uses a material such as PSG, SOG, USG, TEOS or the like. Subsequently, a curing process is carried out in order to densify the second ILD layer 238 and to remove moisture in the second ILD 238. The curing process is carried out in $O_2$, $N_2$ or Ar ambient for about 10 minutes to about 2 hours at the temperature below 550° C. in order to prevent the oxidation of the hard mask 234A.

Figure 4:
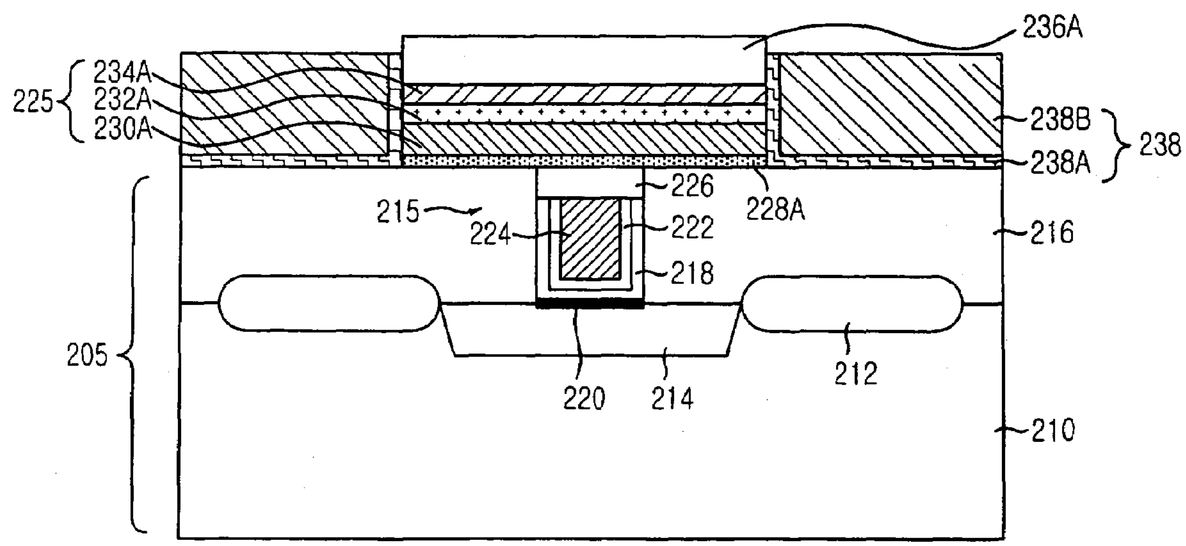
FIG. 4 is a cross sectional view explaining a method for manufacturing an FeRAM capacitor in accordance with another preferred embodiment of the present invention.

Alternatively, referring to FIG. 4, the second ILD 238 can be formed by another shape. That is, a first layer 238A is formed on sidewalls of the capacitor stack 225 and the top face of the first ILD 216. Then, a second layer 238B is formed over the resultant structure. Herein, the first layer 238A uses a material having a good oxygen blocking property such as $TiO_2$, TEOS, $Al_2O_3$ and the second layer 238B uses a material having a good gap-fill property such as PSG, SOG, USG or the like. The first layer 238A plays a role in preventing oxygen diffused into the third barrier 226 along an interface between the second layer 238B and the first ILD 216.

Referring back to FIG. 3D, during the planarization of the second ILD 238, there may be a step between the second ILD 238 and the hard mask 236A. That is, the height of the second ILD 238 becomes lower than that of the hard mask 236A.

Figure 3E:
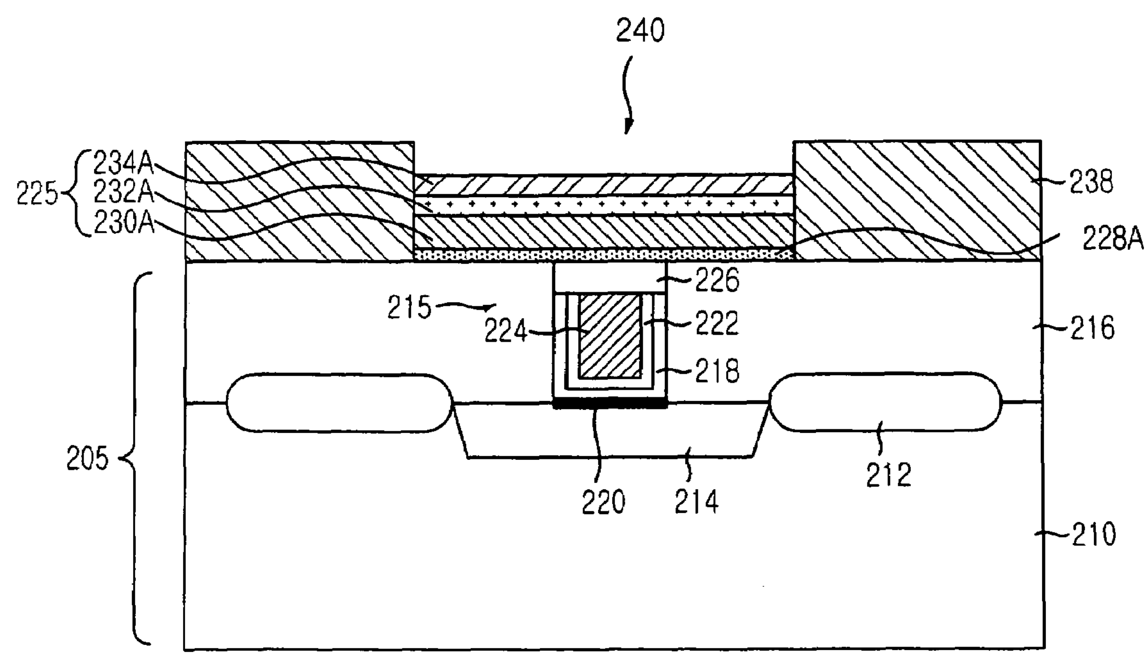

Referring to FIG. 3E, the hard mask 236A is removed by using a wet etching or a dry etching, thereby forming an opening 240. Thus, the height of the capacitor-stack is lower than that of the second ILD 238. Herein, the wet etching process is carried out by using a mixed solution containing $NH_4OH$ such as SC-1 solution of which $NH_4OH$, $H_2O_2$ and $H_2O$ are mixed in a ratio of about 1 to about 4 to about 20. The dry etching process is carried out by using a mixed gas of argon and chlorine gas.

Figure 3F:
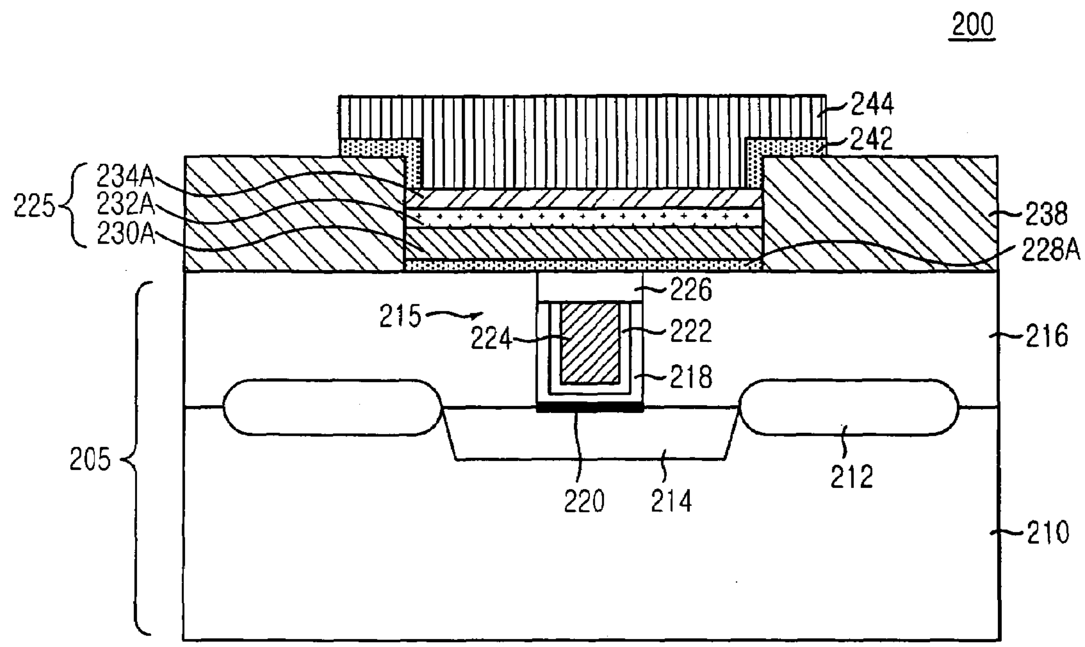

Following the removal of the hard mask 236A, referring to FIG. 3F, a second oxide layer and a third conductive layer are formed on the resultant structure and are patterned sequentially into a fifth predetermined configuration, thereby forming a second glue layer 242 and a plate line 244. Herein, the second glue layer 242 is formed with the thickness ranging from about 5 Å to about 50 Å by using a method such as the PVD, CVD, ALD or the like employing $Al_2O_3$ like the first glue layer 228A. It is very important to form the second glue layer 242 as thin as possible. The reason is that the second glue layer 242 should be removed without a supplementary removing process. That is, in case of forming the second glue layer 242 thinly enough, the second glue layer 242 can be removed in the RTP equipment or the diffusion furnace like the removal of the first glue layer 228. Alternatively, the second glue layer 228 can be removed during the post annealing process for recovering the ferroelectric properties.

The third conductive layer for the plate line 244 is formed preferably with the thickness ranging from about 500 Å to about 3,000 Å by using a method such as the PVD, the CVD, the ALD or the like, the third conductive layer employing Pt, Ir, $Ir/IrO_2$ or the like. The plate line 244 can be formed in a shape of a line type or a block type. Herein, since the plate line 244 also serves as the top electrode, it is possible to form the top electrode thinly and the plate line thickly. Accordingly, it is possible to simultaneously pattern the capacitor stack 225 by means of one-step etching using one hard mask in the present invention.

Figure 5:
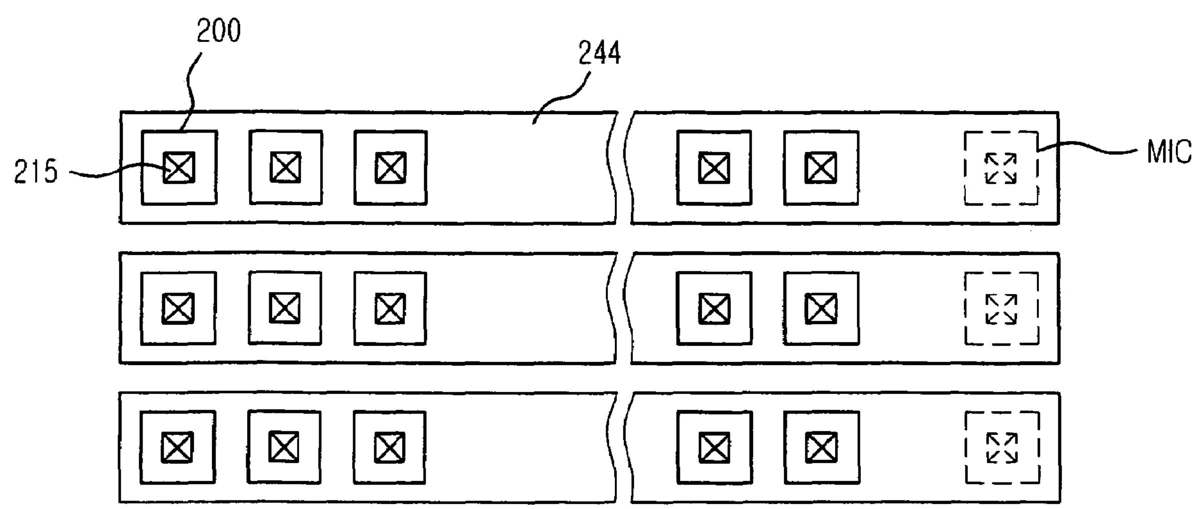
FIG. 5 is a plane view setting forth cell arrays on a wafer incorporating therein the FeRAM capacitor in accordance with the preferred embodiment of the present invention.

Referring to FIG. 5, there is shown a plane view setting forth cell arrays on a semiconductor wafer incorporating therein the inventive FeRAM capacitors 200.

In FIG. 5, the capacitor stack 225 is electrically connected to the storage node contact 215 and the plate line 244 covers a plurality of the capacitor stacks. A metal interconnection contact is formed at the end of the plate line, which is connected to a metal interconnection.

The inventive FeRAM capacitor 200 has several advantages by patterning the capacitor stack 225 in just one step by using one hard mask, thereby forming a vertical capacitor stack 225. That is, since the ferroelectric layer 232A is formed only on the bottom electrode 230A, it is possible to obtain the ferroelectric layer 232A with uniform crystallization after the annealing process. In addition, since there is no step between the bottom electrode 230A and the ILD which is a serious problem in the prior art, it is possible to avoid the crack which is happened during the ferroelectric deposition in the prior art method.

Additionally, since there is no step between the bottom electrode 230A and the ILD, the third barrier 226 is not oxidized during the annealing process for recovering the ferroelectric properties.

Moreover, the inventive FeRAM capacitor 200 has the MTP structure so that it facilitates to carry out a post process for forming the metal interconnection.

While the present invention has been described with respect to the particular embodiments, it will be apparent to those skilled in the art that various changes and modifications may be made without departing from the scope of the invention as defined in the following claims.

What is claimed is:

1. A method for manufacturing a ferroelectric random access memory (FeRAM) capacitor, the method comprising the steps of:

a) preparing an active matrix including a semiconductor substrate, a source/drain region, FOX regions, a first ILD, a storage node contact;

b) forming a first conductive layer, a dielectric layer and a second conductive layer on the active matrix in sequence;

c) forming a hard mask on a predetermined location of the second conductive layer;

d) patterning the second conductive layer, the dielectric layer and the first conductive layer by using the hard mask, thereby forming a capacitor stack having a bottom electrode, a ferroelectric layer and a top electrode, a width of the capacitor stack being larger than that of the storage node contact;

e) forming a second ILD on the first ILD and the hard mask, wherein the second ILD embraces the capacitor stack;

f) planarizing the second ILD till the top face of the hard mask is exposed;

g) removing the hard mask to form an opening above the top electrode; and h) forming a third conductive layer over the resultant structure and patterning into a predetermined configuration, thereby obtaining a plate line of which a width is larger than that of the capacitor stack, the plate line being electrically connected to the top electrode.

2. The method as recited in claim 1, before the step b), further comprising the step of forming a first glue layer between the first ILD and the first conductive layer.

3. The method as recited in claim 2, wherein the first glue layer uses $Al_2O_3$.

4. The method as recited in claim 2, wherein the step of forming the first glue layer is carried out by using a method selected from the group consisting of an ALD, a CVD and the a PVD.

5. The method as recited in claim 2, wherein the first glue layer has the thickness in a range of about 5 Å to about 50 Å.

6. The method as recited in claim 1, wherein the step c) includes the steps of:

c1) forming a hard mask layer on the second conductive layer;

c2) forming a photoresist layer on the hard mask layer and patterning the photoresist layer into a preset configuration, thereby obtaining a photoresist pattern; and c3) forming the hard mask by patterning the hard mask layer into a predetermined configuration by using the photoresist pattern as a mask.

7. The method as recited in claim 6, wherein the hard mask uses a titanium nitride (TiN).

8. The method as recited in claim 6, wherein the hard mask uses a tantalum nitride (TaN).

9. The method as recited in claim 1, wherein the hard mask layer is formed by using a method selected from the group consisting of the PVD, the CVD and the ALD.

10. The method as recited in claim 1, wherein the step f) is carried out by using the CMP process.

11. The method as recited in claim 1, wherein the step f) is carried out by using an etchback process.

12. The method as recited in claim 1, wherein the step f) is carried out by using an etchback process after carrying out the CMP process.

13. The method as recited in claim 1, wherein the second ILD uses a material selected from the group consisting of PSG, SOG and USG.

14. The method as recited in claim 13, wherein the step e) includes the steps of:

e1) forming a first layer on the top face of the first ILD and side walls of the capacitor stack for preventing oxygen diffusion; and e2) forming a second layer on the first ILD.

15. The method as recited in claim 14, wherein the first layer uses a material selected from the group consisting of $TiO_2$, TEOS and $Al_2O_3$ and the second layer uses a material selected from the group consisting of PSG, SOG and USG.

16. The method as recited in claim 1, after the step e) further comprising the step of carrying out a curing process for removing moisture in the second ILD and densifying the second ILD.

17. The method as recited in claim 16, wherein the curing process is carried out in an ambient of gas selected from the group consisting of oxygen ($O_2$), nitrogen ($N_2$) and argon for about ten minutes to about 2 hours at a temperature below about 550° C.

18. The method as recited in claim 1, wherein the step g) is carried out by using a wet etching process.

19. The method as recited in claim 18, wherein the wet etching process is carried out by using a mixed solution of which $NH_4OH$, $H_2O_2$ and $H_2O$ are mixed in a ratio of about 1 to about 4 to about 20.

20. The method as recited in claim 1, wherein the step g) is carried out by using a dry etching process.

21. The method as recited in claim 20, wherein the dry etching process is carried out by using a mixed gas of argon (Ar) and chlorine ($Cl_2$).

22. The method as recited in claim 1, before the step h), further comprising the step of forming a second glue layer between the second ILD and the third conductive layer.

23. The method as recited in claim 22, wherein the second glue layer uses $Al_2O_3$.

24. The method as recited in claim 22, wherein the step of forming the second glue layer is carried out by using a method selected from the group consisting of the ALD, the CVD and the PVD.

25. The method as recited in claim 22, wherein the second glue layer has the thickness in the range of about 5 Å to about 50 Å.

26. The method as recited in claim 1, wherein the first conductive layer is formed with the thickness in the range of about 100 Å to 1,000 Å by using a method selected from the group consisting of the CVD, the PVD, the ALD and a PEALD.

27. The method as recited in claim 26, wherein the first conductive layer employs a material selected from the group consisting of Pt, Ir, Ru, Re, Rh and a combination thereof.

28. The method as recited in claim 1, wherein the dielectric layer is formed with the thickness in the range of about 50 Å to about 2,000 Å by using a method selected from the group consisting of a spin-on coating, the PVD, the CVD and the ALD.

29. The method as recited in claim 28, wherein the dielectric layer uses a ferroelectric material selected from the group consisting of BLT, SBT, SBTN and PZT.

30. The method as recited in claim 1, wherein the second conductive layer is formed with the thickness in the range of about 100 Å to about 1,000 Å by using a method selected from the group consisting of the CVD, the PVD, the ALD and the PEALD.

31. The method as recited in claim 30, wherein the second conductive layer uses a material selected from the group consisting of Pt, Ir, Ru, $IrO_2$, $RuO_2$, Pt/$IrO_2$, Pt/$IrO_2$/Ir, $IrO_2$/Ir, $RuO_2$/Ru, Pt/$RuO_2$/Ru and Pt/$RuO_2$.

32. The method as recited in claim 1, wherein the third conductive layer is formed with the thickness in the range of about 500 Å to about 3,000 Å by using a method selected from the group consisting of the PVD, the CVD and the ALD.

* * * * *